United States Patent [19]

Roybal

[11] 4,295,124
[45] Oct. 13, 1981

[54] COMMUNICATION METHOD AND SYSTEM

[75] Inventor: Philip M. Roybal, San Jose, Calif.

[73] Assignee: National Semiconductor Corporation, Santa Clara, Calif.

[21] Appl. No.: 66,221

[22] Filed: Aug. 13, 1979

[51] Int. Cl.³ .................. H03K 13/00; H04L 3/00
[52] U.S. Cl. ........................ 340/347 DD; 364/900
[58] Field of Search ........ 340/347 DD, 152 R, 147 P; 364/200 MS File, 900 MS File, 725

[56] References Cited

U.S. PATENT DOCUMENTS

| 3,016,422 | 1/1962 | Lee | 340/347 DD |
|---|---|---|---|
| 3,229,047 | 1/1966 | Simpson | 179/100.3 |
| 3,334,335 | 8/1967 | Brick et al. | 340/172.5 |
| 3,400,380 | 9/1968 | Packard et al. | 340/172.5 |
| 3,662,347 | 5/1972 | Fox | 340/172.5 |
| 3,668,647 | 6/1972 | Evangelisti et al. | 364/200 |
| 3,717,851 | 2/1973 | Cocke et al. | 340/172.5 |
| 3,750,147 | 7/1973 | Gregg | 340/347 DD |
| 3,778,617 | 12/1973 | Calhoun | 250/223 |
| 3,810,154 | 5/1974 | Briant | 340/347 DD |
| 4,032,913 | 6/1977 | Okamura et al. | 340/347 AD |
| 4,107,457 | 8/1978 | Hajduk | 178/2 R |
| 4,140,873 | 2/1979 | Kinch | 364/900 X |

OTHER PUBLICATIONS

M. Healey, "Checking the Execution of Programs by Hashing", IBM Tech. Discl. Bull., Dec. 1972, p. 2175.
B. Bloom, "Space/Time Tradeoffs in Hash Coding", Comm. of ACM, Jul. 1970, pp. 422-426.

Primary Examiner—Mark E. Nusbaum
Assistant Examiner—E. S. Kemeny
Attorney, Agent, or Firm—Gail W. Woodward; James A. Sheridan

[57] ABSTRACT

This communication system reduces required data transmission channel capacity by encoding source words into encoded words with usually less binary bits for transmission. Features of the invention include a hashing algorithm which transforms the source words into psuedorandom code words used for both transmission and addresses in a vocabulary memory. Before transmission each source word and its hash code is checked against a pre-recorded vocabulary memory to decide which should be transmitted.

22 Claims, 11 Drawing Figures

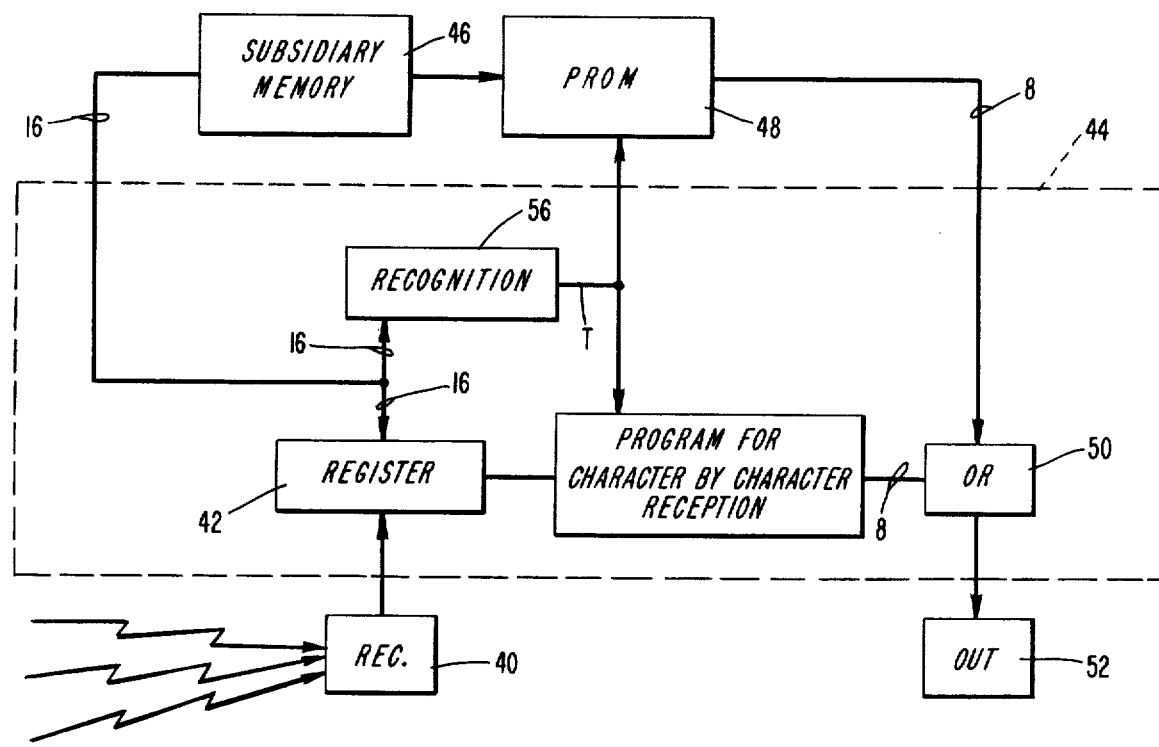
Fig. 2  RECEIVING STATION
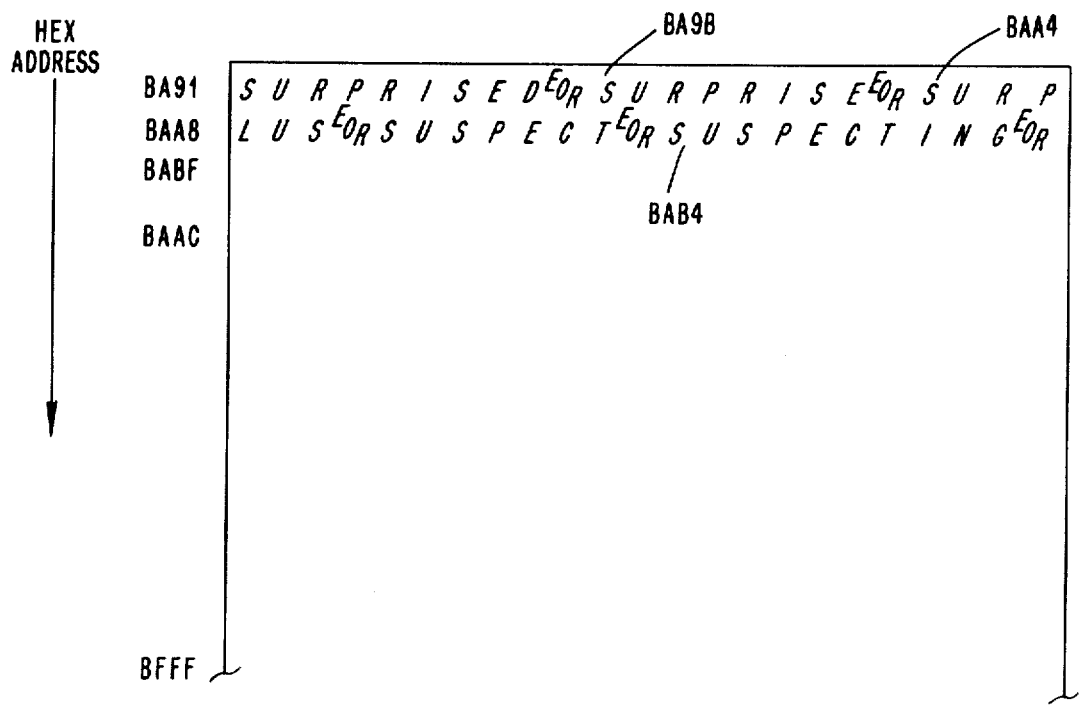
Fig. 3

| 1 COL. CODE | 2 CHAR. | 3 CODE | 4 NO. | 5 CODE | 6 NO. | 7 CODE | 8 ITEM | 9 CODE | 10 WORD | 11 HEXAD. | 12 LETTER | 13 HEXAD. | 14 ENDING |
|---|---|---|---|---|---|---|---|---|---|---|---|---|---|
| 0000 | - | EE00 | 0 | EE10 | -1 | EE20 | NEXT BYTE | EE01 | A | 0 | B | 0 | ABLE |
| 1 | + | 1 | 1 | 1 | -2 | | IS BINARY NO. | 1 | AM | 1 | C | 1 | ED |
| 2 | = | 2 | 2 | 2 | -3 | | | 2 | ARE | 2 | D | 2 | EN |
| 3 | : | 3 | 3 | 3 | -4 | | | 3 | AS | 3 | F | 3 | ER |
| 4 | . | 4 | 4 | 4 | -5 | EE30 | NEXT TWO BYTES ARE BINARY NOS. | 4 | DEAR | 4 | G | 4 | ES |
| 5 | , | 5 | 5 | 5 | -6 | | | 5 | IS | 5 | H | 5 | GH |
| 6 | ; | 6 | 6 | 6 | -7 | | | 6 | IT | 6 | L | 6 | IES |
| 7 | : | 7 | 7 | 7 | -8 | | | 7 | SINCERELY | 7 | M | 7 | ING |
| 8 | / | 8 | 8 | 8 | -9 | 4 | •THREE | 8 | THE | 8 | N | 8 | ION |
| 9 | ( | 9 | 9 | 9 | -10 | 5 | •FOUR | 9 | THEN | 9 | P | 9 | ISM |
| A | ) | A | 10 | A | -11 | 6 | •FIVE | A | THOSE | A | R | A | LY |
| B | $ | B | 11 | B | -12 | EE70 | NEXT SIX BYTES ARE BINARY NOS. | B | TO | B | S | B | MENT |
| C | - | C | 12 | C | -13 | | | C | WAS | C | T | C | S |
| D | % | D | 13 | D | -14 | | | D | WERE | D | V | D | ST |
| E | & | E | 14 | E | -15 | EE80 | FOLLOWING BYTES ARE ASC II | E | YOU | E | Y | E | VOWEL |
| 000F | ? | EE0F | 15 | EE1F | -16 | | | EEF1 | 'S | F | NONE | F | NONE |
| | | | | | | EE90 | FOLLOWING BYTES ARE APP'N CODE | EE02 | USE TO CODE OTHER COMMON | | | | |
| | | | | | | | | EEFF | WORDS | | | | |

Fig. 4

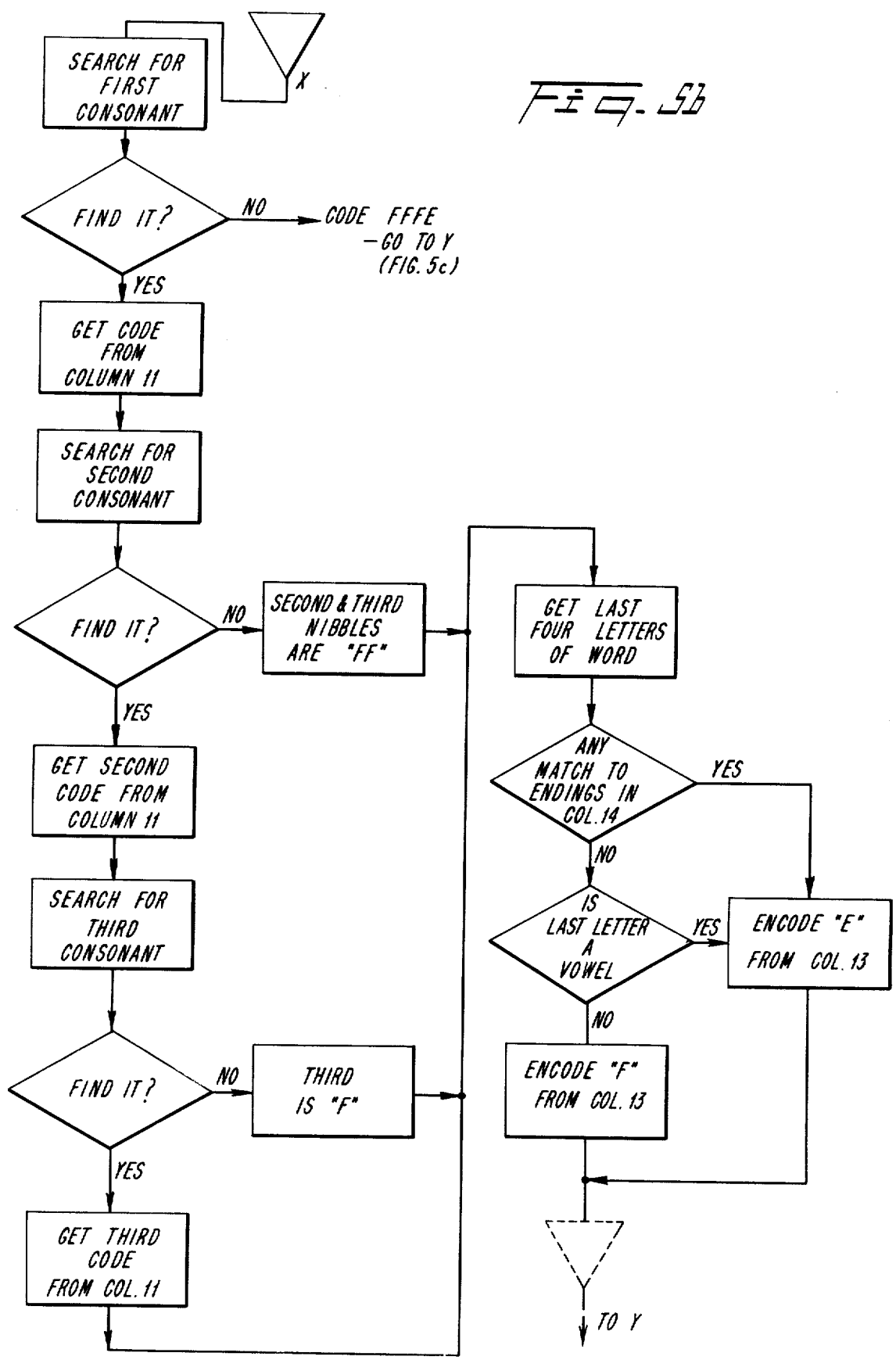

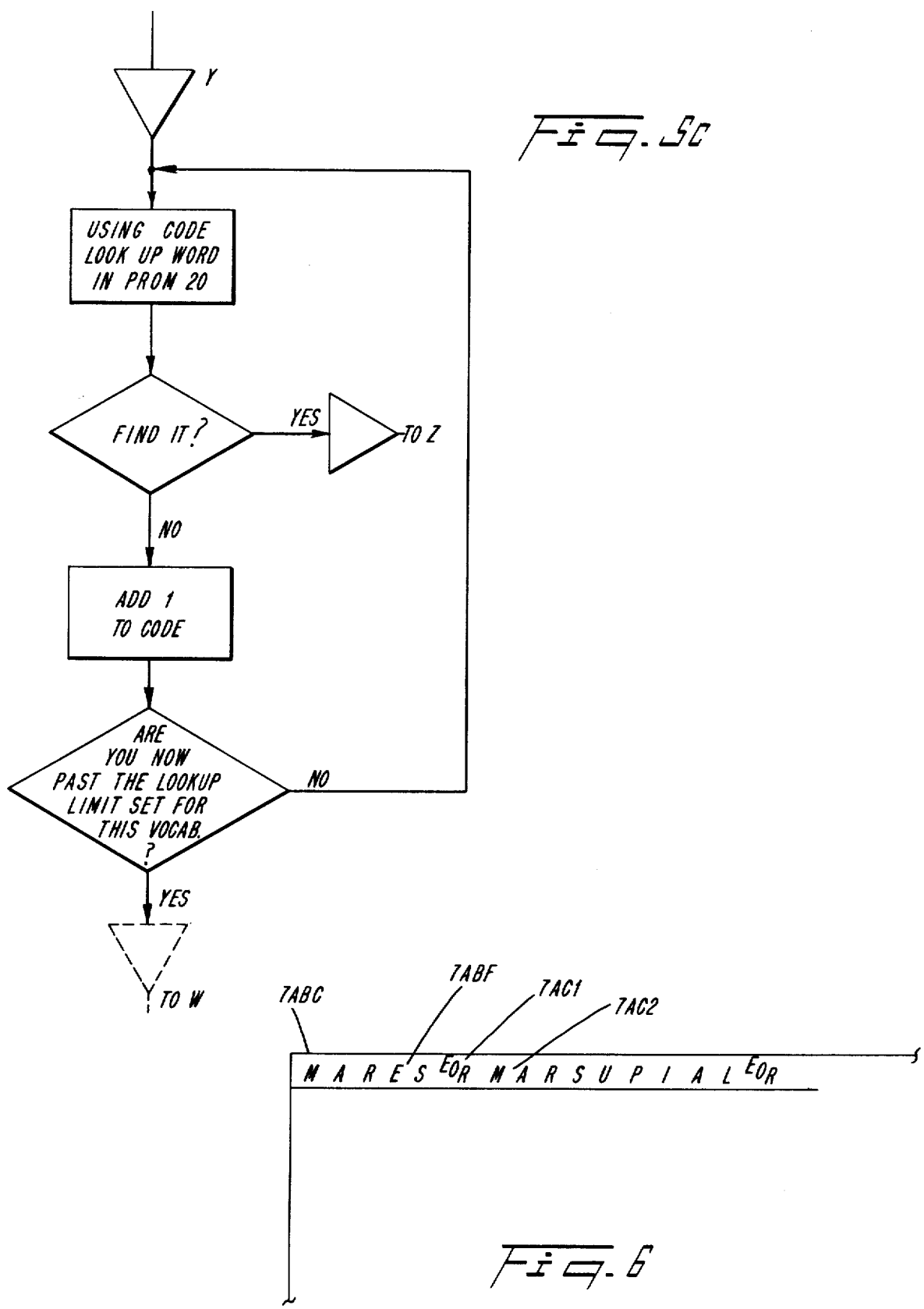

| ORIGINAL TEXT | HEXAD. CODE |
|---|---|
| THE | EE81 |
| HASHING | 5B57 |
| ALGORITHM | 64AF |
| SERVES | BAD4 |
| TO | EE81 |
| CONVERT | 18DF |
| ANY | 8EFF |
| WORD | FA2F |
| IN | 8FFF |
| THE | EE81 |
| SYSTEMS | BEBF EEF1 |
| VOCABULARY | D10F |
| INTO | 8CFF |
| A | EE01 |
| FOUR | 3AFF |
| — | DDD0 |
| NIBBLE | 800F |
| ( | DDD9 |
| 16 | EE20 0010 |
| — | DDD0 |
| BINARY | 08AF |
| DIGIT | 24CF |
| ) | DDDA |
| CODE | 12FF |
| . | DDD4 |

| I TEXT | II HEXAD. | III BINARY CODE | | IV HEXAD. | V BINARY CODE |
|---|---|---|---|---|---|
| M O | 4D 4F | 01001101 | 01001111 | 7AFE | 0111101011111110 |
| R E | 52 45 | 01010010 | 01000101 | | |
| _ I | 20 49 | 00100000 | 01001001 | 83A8 | 1000001110101000 |
| N F | 4E 46 | 01001110 | 01000110 | | |
| O R | 4F 52 | 01001111 | 01010010 | | |
| M A | 4D 41 | 01001101 | 01000001 | | |
| T I | 54 49 | 01010100 | 01001001 | | |
| O N | 4F 4E | 01001111 | 01001110 | EE41 | 1110111001000001 |
| _ | 20 | 00100000 | | | |
| D E | 44 45 | 01000100 | 01000101 | | |
| A R | 41 52 | 01000001 | 01010010 | BC8F | 1011110010001111 |
| _ S | 20 53 | 00100000 | 01010011 | | |
| T A | 54 41 | 01010100 | 01000001 | | |
| N L | 4F 4C | 01001111 | 01001100 | | |
| E Y | 45 59 | 01000101 | 01011001 | EE05 | 1110111000000101 |
| , | 2C | 00101100 | | BA91 | 1011101010010001 |
| S U | 53 55 | 01010011 | 01010101 | | |
| R P | 52 50 | 01010010 | 01010000 | | |
| R I | 52 49 | 01010010 | 01001001 | | |
| S E | 53 45 | 01010011 | 01000101 | | |
| D ? | 44 3F | 01000100 | 00111111 | 0DDF | 1101110111011111 |

Fig. 9

COMMUNICATION METHOD AND SYSTEM

BACKGROUND OF THE INVENTION

The invention relates to a communication system and method. The system involves a novel transmitting system and method and a novel receiving system and method.

Data compression and transmission is highly desirable as saving bandwidth or time of transmission or both. Accordingly, efforts have been made to reduce the time of transmission and compress bandwidth by various means.

U.S. Pat. No. 3,334,335, issued Aug. 1, 1967 to Brick et al. for "Electronic Data Processing" mentions a system in which a word is received in one language and produces an address as an output in response to the word input. The patent itself is concerned with a system in which a second or foreign language word is read out. It also describes systems in which a memory stores each word, an input word being compared with the stored word and a signal generated when a match is found. This match signal is subsequently used to determine the address of the correct stored word. The patent itself is concerned with the indication for match and mismatch of the words.

In another patent, U.S. Pat. No. 3,717,851, issued Feb. 20, 1973 to Cocke et al. for "Processing of Compacted Data," compacted data in the form of variable length codes are employed. These have length-representing prefix portions which are variable-length encoded. The variable length prefixes are decoded by small, fast, search-only associative memories which provide a match-indicating signal as an address to a second memory having conventional storage elements. The output of the last main memory may contain a base address to still another memory and a indication of the bits remaining in the variable length code word.

In U.S. Pat. No. 3,400,380, dated Sept. 3, 1968 to Packard et al. for "Digital Computer Having an Address Controller Operation," there is described a computer system in which digit, or four bit data representations, are transferred to character or eight bit format.

Other examples of conversion systems are described in U.S. Pat. No. 3,229,047 of Jan. 11, 1966 to Simpson for "Data Conversion Systems"; U.S. Pat. No. 3,662,347 of May 9, 1972 to Fox for "Signal Compression and Expansion System Using a Memory"; U.S. Pat. No. 3,778,617 of Dec. 11, 1973 to Calhoun for "Container Inspection Apparatus"; and U.S. Pat. No. 4,032,913, issued June 28, 1977 to Okamura et al. for "Coding Equipment Providing Compressed Code."

SUMMARY OF THE INVENTION

A substantial portion of the vocabulary to be employed in messages is stored in a main read-only memory (ROM) at addresses determined by a so-called hashing algorithm. The words of a message to be transmitted are entered in a conventional character-by-character coded format, such as ASCII, and are each transformed by the algorithm to an address. The word may be stored at that address or the address may lead through an intermediate read-only memory (ROM) to the final address of the word in the main ROM. The word stored at that final address in the main ROM is compared with the word of the message. If identity is found, the address is transmitted. At the receiving station, the address is recovered and applied to an ROM having like addresses and like words stored at those addresses as those of the transmitting station main ROM. The message is therefore reconstituted word by word.

Since the transmitted address has a fixed length that will usually be much shorter than the character-by-character coded word it represents, considerable data compression in transmission can be achieved.

If during transmission identity is not found or a special transmission is to occur, a special character is formed and transmitted indicating that subsequent transmission is a character by character transmission and not an address. Provisions may be made for the transmission of special endings and special characters.

DESCRIPTION OF THE DRAWINGS

The various objects, advantages and novel features of the invention will be more fully apparent from the following detailed description when read in connection with the accompanying drawings in which:

FIG. 2 is a schematic diagram in block form of a receiving station embodying the invention;

FIG. 3 is a diagrammatic representation of a portion of memory useful in understanding the invention;

FIG. 4 is a set of tables useful in explaining the coding of the application;

FIG. 5, comprising FIGS. 5A, 5B, and 5C, is a flow diagram useful in explaining the method of operation of the apparatus of FIG. 1;

FIG. 6 is a schematic representation of the storage of two words in memory useful in explaining a problem in addressing words which have similar or nearly alike addresses;

FIG. 7 is a schematic representation which aids in illustrating how indirect addressing may increase the efficiency of operation; and FIGS. 8 and 9 are illustrations of examples showing the savings over ordinary ASCII encoding achieved by the method and apparatus of the invention.

DETAILED DESCRIPTION

Transmitting Station

Figure 1:
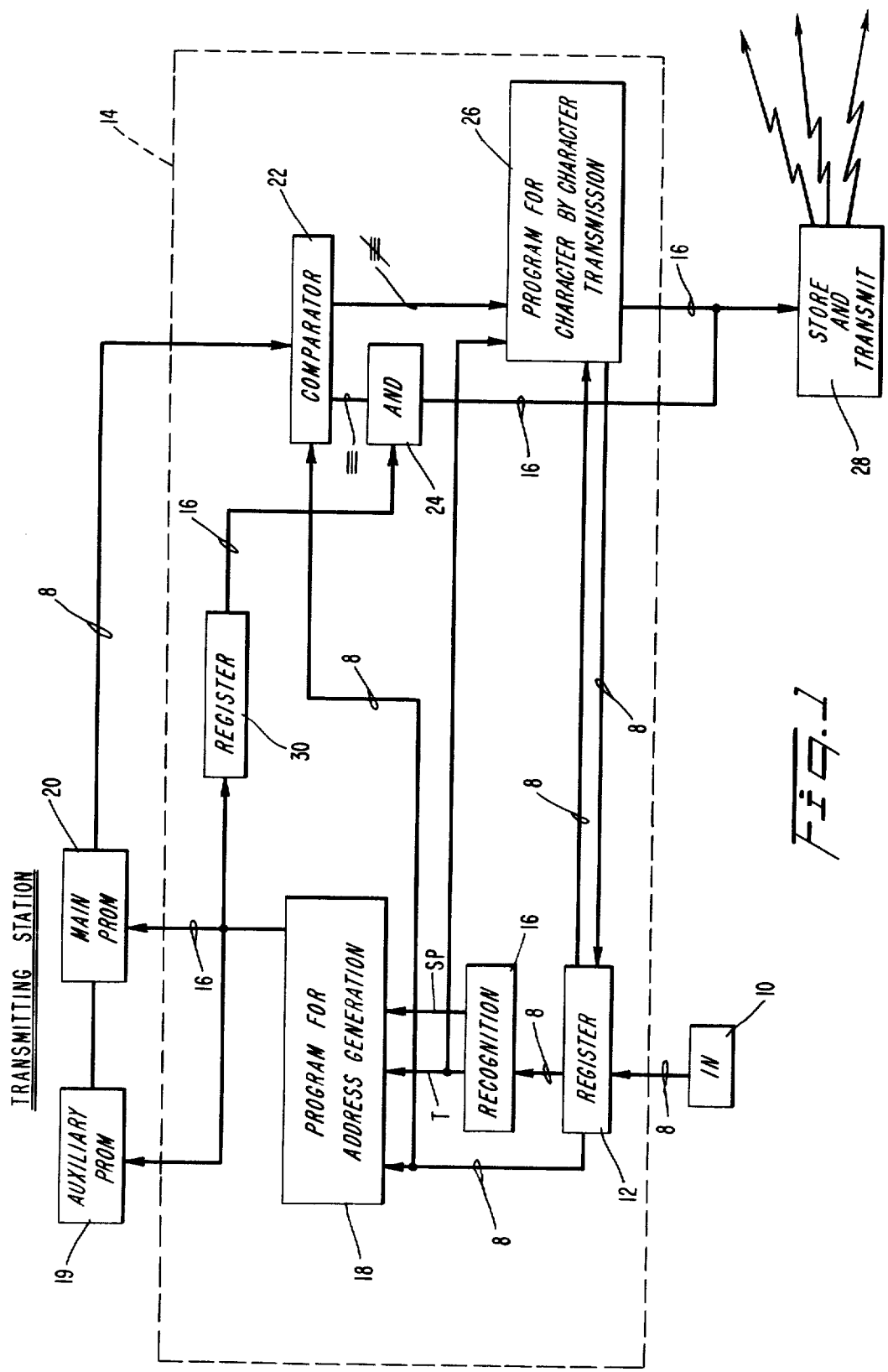
FIG. 1 is a schematic diagram in block form of a transmitting station embodying the invention.

Referring now more particularly to FIG. 1, an input device 10, which may be any standard input device, for example, one which provides an output in ASCII (American Standards Code for Information Interchange) is connected to a register 12 which receives its output. The register 12 may be a register inside of a digital computer 14. The ASCII code comprises two bytes of four binary digits or bits each. Hence, the connection from the input 10 to the register 12 may be an eight line cable. A recognition circuit 18 is provided in this case shown internally of the computer although it may be external. The recognition circuit receives from the register each ASCII character in turn as it is entered through an eight bit cable. The recognition circuit 16 may be any of the known decoding circuits, for example, one comprising one or more trees of gates, or it may be arranged by programming. If a space is recognized by the circuit 16, a line SP connected to a block indicated as the Program for Address Generation 18 activates the program for address generation in accordance with the hashing algorithm, to be described in greater detail hereinafter. The program may be stored in the internal memory of the computer 14. Upon actuation of the program, each of the ASCII characters is read out (nondestructively) in turn from the register 12 as indicated symbolically by the line connected from the register 12 as an input to the program for address generation 18 and the entire word, which may be several ASCII characters, is transformed into a sixteen bit initial address. The initial address is applied by the program 18 to an auxiliary programmable read only memory (PROM) 19 and the final address stored at the initial address in the auxiliary PROM is read out and applied to a computer 22 and an AND circuit 24.

Meanwhile, the comparator also receives from the register 12 each character as it is applied to the program for address generation 18. The word supplied from the memory 20 is then compared by the comparator 22 with the word received by the register 12. If the comparator indicates identity, the AND circuit 24 receives a signal from the comparator so indicating through a connection with one of its outputs and permits the sixteen bit address, which meanwhile may have been stored in a suitable register 30, to be applied to a transmitter 28 for transmission. The register 12 is cleared for the next word. The transmitter may include a suitable temporary storage device such as a disc or other storage to accumulate characters for transmission either bit by bit or a byte at a time.

If there is no identity, the address may be advanced either by increments or to the next stored EOR (end of record) symbol in memory, the next word read out and compared for identity, etc. As will appear more fully hereinafter, the successive words are often formed of the same root. The successive read-outs are continued until identity is indicated or some maximum number of trials reached.

If the comparator 22 still indicates non-identity after the maximum number of trials, then a program for character by character transmission 26 which also may be stored in the internal memory of the computer 14 is activated to withdraw characters from the register 12, either the sole character that is within the register, or successive characters, until the word that is stored in the register is withdrawn and applied by the program to the transmitter. In doing so, the program may generate a special character indicating that the following transmission is intended for character by character reading at the reception end, that is, at the receiving station and at the completion of the word may generate another character to indicate that the character by character transmission is terminated. When all characters have been read out of register 12 for transmission, the register is again cleared.

If the recognition circuit 16 recognizes as true, the reception of certain characters it may immediately activate the program for character by character transmission 26, but only for transmission of the single character within the register 12, and without the necessity for the generation of the characters indicating character by character transmission but with the addition of certain digits to complete an arbitrary sixteen bit character which may be considered as a pseudo-address. Such a pseudo-address may be recognized at the receiving station. At the same time that the recognition circuit 16 indicates as true, the recognition of a certain character, the indication inhibits the generation of the general program for address generation 18.

The transmitter 28 may store the 16 bit words it receives as described heretofore for one of more messages and then may transmit either bit by bit, or by bytes or by words as may be convenient considering the transmission system used, in order to save bandwidth and to compress transmission time.

Receiving Station

Referring more particularly to FIG. 2, a receiver 40 receives the transmission from the receiver 28 of FIG. 1. The sixteen bit characters are entered in a register 42 character by character as they are received. The sixteen bit characters may be applied from the register 42 to a subsidiary memory 46 and thence to a programmable read only memory 48. The memory 48 has like words stored to like addresses to those of the main or principal memory 20 of FIG. 1. The words from the read only memory 48 of FIG. 2 may be read out, an ASCII character at a time that is, a character of eight bits or one byte at a time. The read out time may be slower than the time for address characters to be received by the receiver 40. Therefore, the subsidiary memory 46 may be employed to provide temporary storage, each address being supplied from subsidiary memory 46 after the word addressed by the next previous address has been read out from PROM 48.

The output from the programmable read only memory 48 may be applied through an OR circuit 50 to an output 52, for example, a printer. The OR circuit 50 also receives eight bit characters from a program for character by character reception 54 which is activated by an output from a recognition circuit 56 connected to receive the true output from recognition circuit 56 connected to receive the sixteen bit coded addresses or pseudo addresses from the register 42. The recognition circuit 56 may also provide recognition for certain specially coded characters, and these by the program 54 will be translated and applied to the OR circuit 50 as individual characters in ASCII code.

Operation

Although the operation will be reasonably clear from the preceding description, it may be summarized as follows. A message to be transmitted is entered at the input 10 character by character. Each word is stored in the register 12. If there is no recognition of the characters, either the special characters or a space, the register receives the word until a space is encountered and recognized. On recognition of the space, the hashing program for address generation 18 is activated and a sixteen bit address is generated. The address is applied to the auxiliary memory 19 and the programmable read only memory 20. A word in ASCII code is read out from the memory 20 and entered in the comparator 22. This word is compared with the word read out from the register 12. If identity is indicated, the address applied to the memory 20 which has been stored in the register 30 is now sent through the AND circuit 24 to the transmitter 28 and the address is transmitted. If not, the next word is read. If identity is achieved, that address is transmitted. If not, the process is repeated a preassigned maximum number of times.

If, after the trials, there is still a failure of identity in the comaparator 22, failure is indicated by activating the program for character by character transmission. The eight bit characters are read sequentially from the register 12, transformed to sixteen bit characters, of which eight bits are the ordinary ASCII code, and transmitted through the transmitter 28, until the space is read out by the program for character by character transmission and the register 12 is empty or contains solely blanks or nulls. At this time, the program 26 insures that all registers and circuits are reset and the process may begin again.

If the recognition circuit 16 recognizes a special character, the program for address generation may be activated to address a particular address in the memory 20 in which the special character appears in ASCII code. The ASCII code is then compared with the character from the register 12, and if identity is indicated, the register 30 passes the sixteen bit address through the AND circuit 24 into the transmitter 28 for transmission.

Memory Storage

The average person's speaking vocabulary is about 10,000 words, and his reading vocabulary is between 25,000 and 50,000 words. Therefore, using sixteen bits of data (a two-byte word or character) a system can point to the address of any word likely to be transmitted. If a special vocabulary is desired, there is space available for additional words, or the vocabulary may be modified. Each of the words are stored in a large read only memory (ROM). A programmable read only memory (PROM) such as memory 20 is desirably used so that changes if desired in vocabulary or addresses may be accomplished rather readily. Therefore, each of the PROMs 20 and 48 of FIGS. 1 and 2 respectively are programmed to store the desired words. A typical english word normally requires five to ten characters, each character of one byte, for representation using ASCII. Therefore, use of the ROM as described should achieve a data compression factor in transmission of from two to four.

If required, numerical data may be transmitted as ASCII or preceded by a special unique character indicating that what follows is character by character transmission and then the character by character transmission terminated by the same or similar special unique character.

Referring to FIG. 3, the tables indicate several words stored in PROM 20 (or 48) and shows how the addresses may appear in hexadecimal characters. Each hexadecimal character may assume any of the values 0-15, the letters A-F representing respectively digits for the values 10-15. In other words, each hexadecimal character represents a four bit digit and the four characters of the address in FIG. 3 represents a sixteen-bit or two-byte address. In the representation of FIG. 3, the memory is shown in a completely schematic way. Usually, the addresses are in blocks of multiples of two, whereas here is shown a storage length of 23. The symbol or character EOR (end of record) is used in a known way and designates the end of the word. By using EOR, the words may be stored in a "packed" manner enhancing density of storage over using a line for each word. The addresses are indicated in hexadecimal characters, four such characters or two bytes to an address. It will be understood that each address refers to a location at which is stored at least seven binary digits to supply the ASCII code for the character at that address.

Hashing Algorithm

The hashing algorithm serves to convert a word into an address in this instance corresponding to four hexadecimal characters. Each hexadecimal character may be converted into or considered as a four-bit number.

Before attempting to convert the word presented into the address in hexadecimal code, by the hashing algorithm, certain preliminary steps are taken. As the characters are presented to the register 12 in ASCII code, a suitable recognition circuit, either part of the circuit 16 or a separate circuit, will recognize one of the punctuation characters shown in column 2 of FIG. 4. If such a character is recognized, the computer enters a separate memory, not separately shown, or what is equivalent, a portion of the PROM 20 at the corresponding address indicated in column 1 of FIG. 4. Thus, the slash sign (/) is indicated as the four hexadecimal character word DDD8. This hexadecimal word then is the 16 bit character which addresses the memory 20. The word entries then are withdrawn and carried into the comparator 22. If identity is indicated as it should be, the word DDD8 will then pass through the AND circuit 24 for transmission. Similarly, if any of the numbers 0 to 15 inclusive or minus 1 to minus 16 inclusive is recognized, then the corresponding hexadecimal word location in column 3 for the numbers listed in column 4 and located in column 5 for the numbers listed in column 6 may be employed as the address. If a binary number is recognized or a sign is recognized which does not fall within the numbers indicated in columns 4 and 6, the computer generates a number such as EE20 to indicate that the next byte is a binary number, or EE30 to indicate that the next two bytes are binary numbers and so forth through EE70 showing that the next six bytes are binary numbers as indicated in columns 7 and 8. Optionally, these numbers may be transmitted successively in ASCII, as described next, by preceeding and following transmission by EE80 and EE90 respectively. If the bytes to follow are to be ASCII code then the hexadecimal word EE80 is transmitted. Similarly, the hexadecimal word EE90 indicates that the following bytes are addresses in accordance with the hashing code of the application.

Turning to the hashing algorithm itself, assume that a word is entered in the register 12. The word or combination of characters may be any of those indicated in column 10, in which case they will be recognized and coded into the corresponding four hexadecimal character word in column 9. Additional words may be coded into the four character hexadecimal words indicated at the bottom of column 9 beginning with EE02 through EEFF. In other words, as many words are coded into the four hexadecimal character word EE01-EEFF as may be convenient for the particular types of transmission at hand.

If none of these words are recognized, then the machine starts a scanning procedure from the left hand character, as written in English, searching for a consonant. If there are no consonants, the code will be FFFE, as indicated at the last hexadecimal character in column 11. The same coding applies if a consonant is located which is not shown in column 12, such as the letter J or K. If on the other hand, one of the consonants shown in column 12 is found, then the hexadecimal character corresponding to that character in column 11 is employed. The scan is continued for another consonant. If none is found, an F is entered. The scan is continued for a third consonant in the column 12. If it is not found, an F is again entered. If three consonants are found, only the last four letters of the word are considered. The last four letters are compared with the combinations tabulated in column 14. If a match is found, the hexadecimal character in column 13 corresponding to the character in column 14 is used as the fourth character of the four hexadecimal character address. This process may be broken down into a sequence in which the last four letters are matched against the four letter sequences of column 14, and if no four letter match is found, then the machine searches for three letter matches, etc. If no ending matching those listed in column 14 is found, then the corresponding hexadecimal character is F as indicated in column 13.

Flow Chart

Figure 5A:
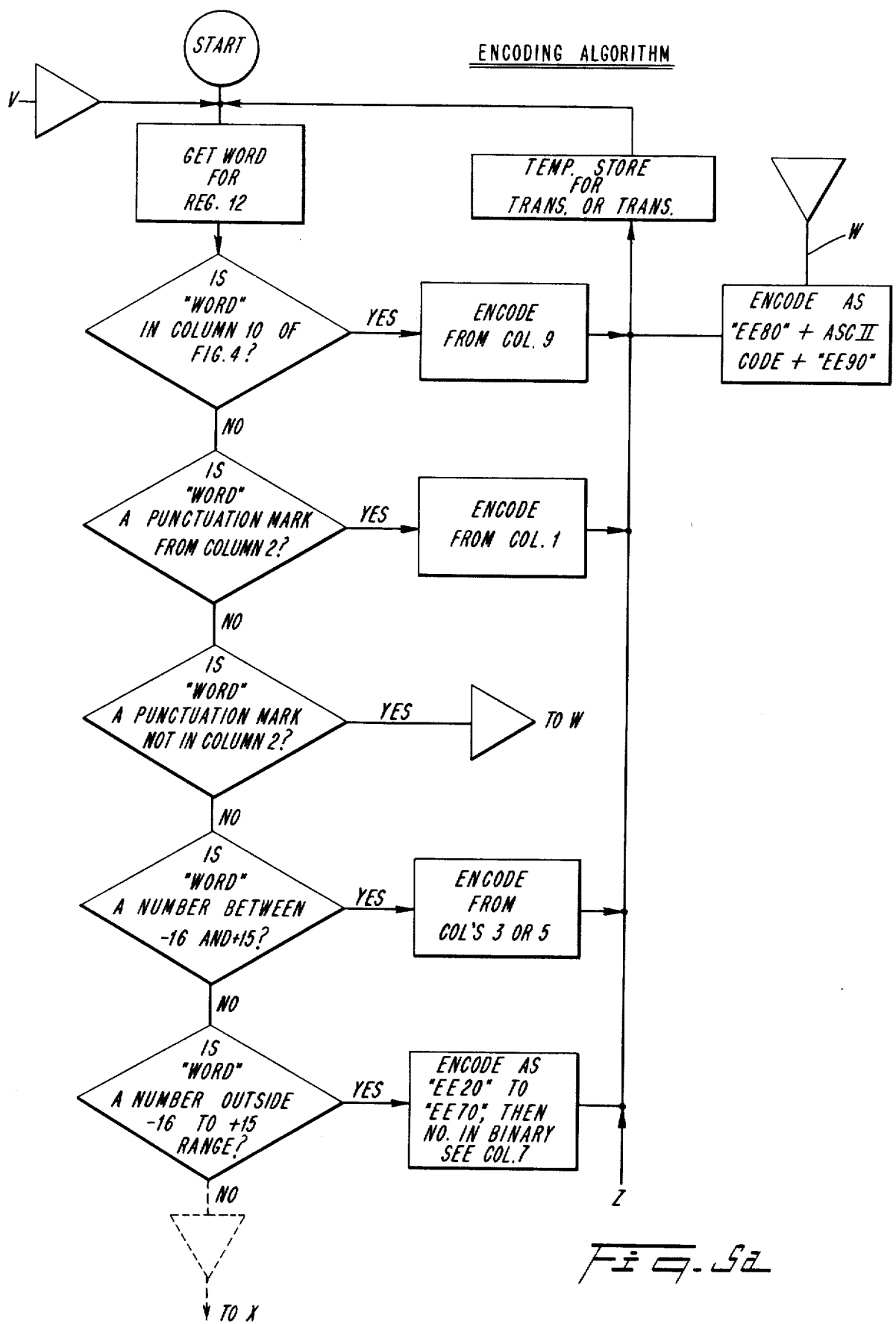

The manner in which any word is to be treated and the hashing algorithm employed will be more fully apparent from the flow chart of FIG. 5. Starting at the top of FIG. 5A, the program starts when the computer gets a word (including a punctuation mark) as indicated for register 12. Next, the program makes a comparison to determine if the word is in column 10 of FIG. 4. If yes, the word is encoded as the corresponding four hexadecimal character word of column 9 of FIG. 4 which then provides the address for the memory. This code is used for the address, stored for transmittal or transmitted, and the next word may be obtained as indicated in the flow diagram. If the word is not found in column 10 of FIG. 4, then a test is made to determine if the word is a punctuation mark from column 2 of FIG. 4. If the answer is yes, the "word" is encoded from the corresponding entry in column 1 of FIG. 4 and that code is used for the address before obtaining the next word for consideration. If the answer is no, the word must be tested to determine is it is a punctuation mark not found in column 2. If the answer is yes, the program proceeds to a point indicated as W in the flow diagram of FIG. 5A. If the answer is no, the program inquires whether the word is a number between minus 16 and plus 15. If yes, it will be encoded by reference to columns 3 or 5 corresponding to the number located in column 4 or 6 of FIG. 4, and the resultant code will be used for the address. If the answer is no, then the question is whether the word is a number outside of the minus 16 to plus 15 range. If the answer is yes, it is encoded as EE20 to EE70 and then a number in binary form as indicated in the entry in column 7 corresponding to the item in column 8. The resultant coding is either transmitted or entered for temporary storage for transmission. If the answer is no, we come to point X in the flow diagram which is continued in FIG. 5B.

As indicated in FIG. 5B, the next step is to search for the first consonant in the word in the register 12, starting from the left. If no consonant of column 12 of FIG. 4 if found in the word, the code is FFFE corresponding to no consonant as noted in column 12 and coded by column 11, with a vowel ending, coding E as shown in column 13. The resultant hexadecimal code is employed at point Y of the flow diagram in FIG. 5C to which reference will be made later.

If a consonant is found, the corresponding first hexadecimal code character (called a "nibble" in the flow diagram) is located in column 11, corresponding to the consonant found in column 12 of FIG. 4. The next step as indicated in the flow diagram of FIG. 5B is to search for the second consonant. If the second consonant is not found, then the second and third hexadecimal characters (nibbles) are FF corresponding to the column 11 character for failure to locate a consonant in the list of column 12.

If a consonant in the list of column 12 is found, the second code hexadecimal character is the corresponding character found in column 11. The next step is to look for the third consonant. If no third consonant corresponding to the listing in column 12 is found, than the third hexadecimal character is F, as is apparent from columns 11 and 12. If a third consonant is found corresponding to the listing of column 12, the corresponding hexadecimal character is located as listed in column 11 to form the third character of the address.

If the second and third consonant of the list of column 12 are not found or if the third consonant is not found, or if the third consonant is found, there have now been formulated three of the hexadecimal characters of a four hexadecimal character address. In order to form the fourth hexadecimal character or nibble, the last four letters of the word are compared with any of the four character endings in column 14. If a match is found, the fourth character is taken from the corresponding hexadecimal character of column 13. If a match is not found, then a comparison is made for the three-character endings, and then for the two-character endings. The successive steps are not shown separately in FIG. 5B for simplicity. Finally, a comparison is made for the single character endings of column 14 or for a vowel ending, or for an ending not found in column 14. If a vowel, the coding for the fourth character is a hexadecimal E, and if no match is found for any endings of column 14, the hexadecimal coding will be an F. Accordingly, there has now been formulated a four hexadecimal character address and we now proceed to point Y of FIG. 5C in the flow diagram.

Referring to FIG. 5C, the four hexadecimal-character code thus derived is now used to look up a word in the PROM 20. The address in the PROM is accessed, the word withdrawn character by character until an EOR is located, and the results stored in the comparator 22 of FIG. 1 for comparison with the word in the register 12. If identity is indicated, the word is found, as indicated by the "yes" answer to the question "find it?" in the flow diagram. The word is then entered for temporary storage for transmission or for transmission directly as indicated in the flow diagram portion of FIG. 5A which is entered at the point Z for this eventuality. If the word does not indicate identity, then the comparator is cleared, and a one or unit added to the hexadecimal coded address. If the original address has now been incremented a number of times exceeding the look-up limit set for the vocabulary involved, then we go to point W of the flow diagram in FIG. 5A and subsequent characters of the word are encoded as ASCII code, preceded and followed respectively by EE80 and EE90. On the other hand, if the limit has not been exceeded, as indicated in the flow diagram, a loop occurs in which the word is again looked up with the incremented address. This process continues until either the word is found in memory identical with the word in the register or until the look-up limit has been exceeded, and the characters of the word are transmitted in ASCII code.

In all cases whether or not the word being hashed is actually in the PROM or not, the hashing program works to hash the word into an address. If the address, upon investigation, actually contains the word in question, then the address is transmitted or stored for transmission. If the address does not contain the word under investigation, an incremented address may be queried for identity, and if found, the incremented address is transmitted or stored for transmission. In either of these cases, a unique address is transmitted to the receiver which will find the word at the address. If the word is not found at an initial address or an incremented address within the limits of incrementing, then the letters of the word are transmitted as ASCII characters.

Indirect Addressing

One of the problems associated with the system as heretofore described is that the encoded address often points to a letter of the word other than its initial letter. As an example, consider the two words "mares" and "marsupial" under the algorithm as specifically described in using the tables of FIG. 4, we see that "mares" encodes as an address 7ABC, whereas "marsupial" encodes as 7ABF. If the two words are stored in memory as displayed in FIG. 6, it is apparent that several program loops must be traversed before the word marsupial is found at 7AC2. Moreover, it is apparent that with some words, many loops must be traversed, taking a great deal of time, before the initial letter of the desired word is found and identity is recognized. This situation requires a realistic program to carry a large limit as the maximum number of loops for incrementing in the program.

Figures 7, 8:
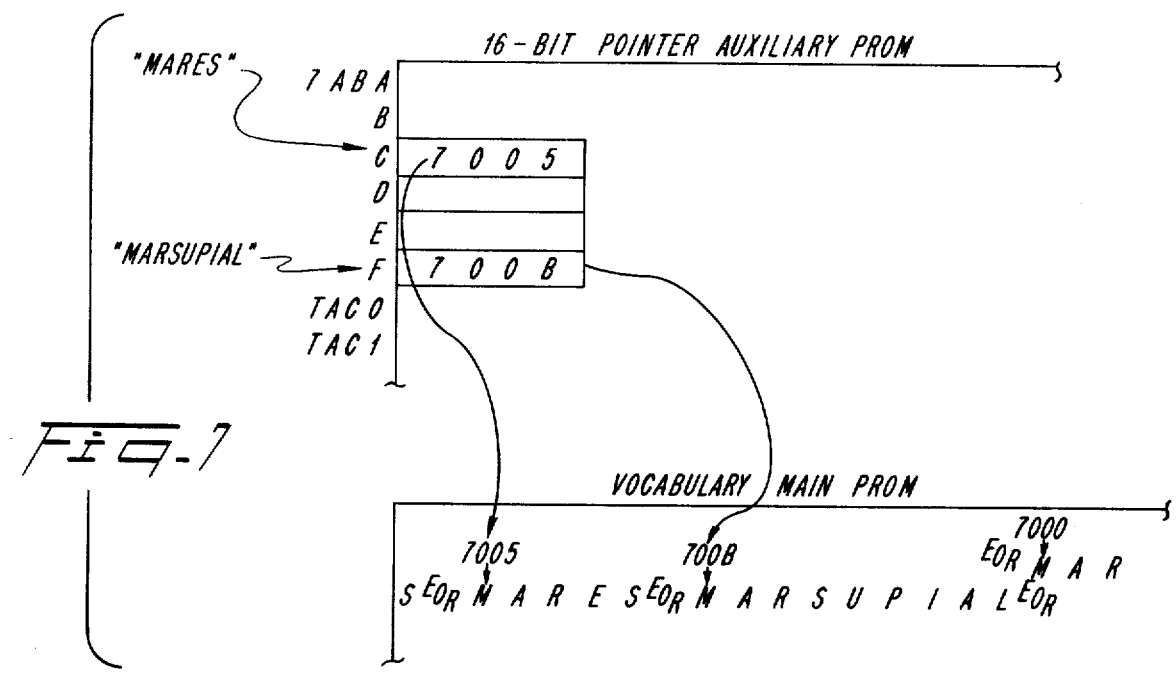

A great deal of time may be conserved by using indirect addressing. The PROM 20 is reduced to a pair of memories, or divided into two memories, the first of which would be a 64 K memory, that is, 2EXP16 which has at each location for use, a four hexadecimal characer which constitutes an address. The 64K memory (which may be an 8K bit by 8 bit array) stores addresses that are always the initial address of a word of four hexadecimal digits, as illustrated in FIG. 7. Each of the addresses in the pointer PROM points to the initial letter of the corresponding word stored in the vocabulary PROM 20. In effect, the pointing or auxiliary memory accomplishes the incrementing or advances the addresses when required, though not always by unity. It will be apparent from the foregoing example that an excessive number of repeated loops in the program are avoided or reduced by the expedient of the indirect addressing.

EXAMPLES

Examples of coding which illustrate the reduction in the number of bits to be transmitted by using the method and apparatus of the application are illustraed in FIGS. 8 and 9. Referring to FIG. 9, the text "more information dear Stanley, surprised?" is a message text written in clear text under heading I. Under the next heading II, the corresponding ASCII code is shown as expressed in hexadecimal characters, a pair of hexadecimal characters (or a byte) for each alphabetical character. Under the succeeding heading III, the ASCII code is expressed in binary digits or bits. Under the succeeding heading IV, the clear text characters are coded according to the application code in hexadecimal characters, and in bits under the heading V. There is a recognizable advantage in using the application code. There are 80 hexadecimal characters in the coding of the clear text according to the ASCII code or 320 binary digits. There are only 28 hexadecimal characters or 112 binary digits using the method of the application. It is apparent that there is an advantage of almost three to one in code compression by employing a coding according to the application.

Referring to FIG. 8, a further example is illustrated. A clear text reads "the hashing algorithm serves to convert any word in the system's vocabulary into a four nibble (16 binary digit) code." When the message is encoded according to the ASCII code it requires 119 bytes or 952 binary digits to encode. Using the coding algorithm of the present application, only 54 bytes are required or 432 binary digits for the same storage. In this example, there is a saving by using the method of the application of nearly two to one as compared to the ASCII code.

It will be apparent from the foregoing that the application affords a superior method and apparatus for the encoding of information for transmission.

What is claimed is:

1. A method of encoding input words for transmission, each of said input words being coded character by character in a first binary digit code, comprising the steps of:
   generating from each of said input words a second code to serve as a memory address,
   entering the address in a first memory to derive the word stored at that address in said first memory,
   comparing for identity the stored, addressed word with the input word,
   transmitting the address if, and only if, identity is found in the comparison,
   receiving the transmitted address,
   entering the received address in a second memory having like words stored at like addresses to those in said first memory, and
   reading out from said second memory the word stored at the address entered in the second memory.

2. A method as claimed in claim 1, wherein said step of generating a second code from each of the input words comprises generating a second binary digit code from each of said input words.

3. A method as claimed in claim 1, wherin the step of generating a second code comprises generating said second code from said first code by a hashing algorithm.

4. A method as claimed in claim 1, further including the steps of:
   generating if, and only if, identity is not found, a unique character signifying character by character transmission, and
   thereafter transmitting the input word character by character while inhibiting transmission of any address of a word stored in said first memory.

5. A method as claimed in claim 4, comprising the further step of generating a second unique character to signify termination of character by character transmission.

6. A method as claimed in claim 1, further comprising the steps of:
   generating a unique character if, and only if, identity is not found in the comparison, said unique character signifying character by character transmissions,
   then transmitting the word character by character until all characters in the word have been transmitted,
   then generating and transmitting a second unique character signifying termination of character by character transmission, and
   receiving the words so transmitted character by character.

7. A communication system for encoding and transmitting a message comprising words each one of which is composed of characters coded in a first code, comprising:
   a first register for receiving entry of a word to be transmitted, said entry being coded character by character in said first code, a code generation means for generating from the word entered in said register an address, a first memory being addresses and having words stored at said addresses, said memory being connected to receive the generated address and to read out the corresponding word stored at said address, means for comparing for identity the word read out by said first memory and the word received in said register, means for transmitting the memory address of said word if, and only if, the comparing means indicates identity, means including a second register for receiving said transmitted address, a second memory having like addresses and like words stored at said addresses as those of said first memory, and connected to receive from said second register the transmitted address and to read out the word stored at said address.

8. A communication system as claimed in claim 7, said code generation means including means for executing a hashing algorithm for determining addresses from words in said word code.

9. A communication system as claimed in claim 7, further comprising:

means for recognizing one or more characters of a word entered in said first register, means for generating in response to the recognition a unique character, and means responsive to said unique character for causing said trasmitting means to transmit character by character, the characters of the word entered in said first register.

10. A communication system as claimed in claim 9, said generating means further including means for generating a further unique character indicating termination of the character by character transmission.

11. A method of encoding input words for transmission, each of said words being composed of characters coded in a first code, comprising the steps of:

generating from each of said input words a second code to serve as a memory address, entering the address in a memory to derive the word stored at that address in the memory, comparing for identity the stored, addressed word with the input word, and transmitting the address if, and only if, identity is found in the comparison.

12. A method as claimed in claim 11, said second code being a binary code.

13. A method as claimed in claim 12, further including the steps of:

recognizing one or more characters of an input word as signifying character by character transmission, and in response to said character recognition transmitting the input word character by character.

14. A method as claimed in claim 13, further including the steps of generating a unique character to signify termination of character by character transmission.

15. A method as claimed in claim 11, further comprising the step of comparing in the first code the word in said memory at said address for identity with the input word before transmitting the address, and transmitting the address only if identity is found.

16. A method as claimed in claim 15, comprising the further steps, if identity is not found, of incrementing the address, entering the incremented address in memory to derive the word stored at the incremented address, and again comparing the word derived from memory for identity with the input word.

17. A method as claimed in claim 16, wherein the incrementing, entering and comparing steps are repeated until identity is found or a maximum number of incrementing steps have been performed.

18. A method as claimed in claim 17, in which, if identity is not found, the word is transmitted in the first code.

19. A system for encoding and transmitting messages comprising words which are composed of characters coded in a code, comprising:

a register for receiving entry of a word to be encoded and transmitted, said entry being coded character by character in said code, a code generation means for generating from the word entered in said register an address, a memory having addresses and having words stored at said addresses, said memory being connected to receive the generaed address and to read out the corresponding word stored at said address, means for comparing for identity the word read out by said memory and the word received in said register, and means for transmitting the memory address of said word, if, and only if, the comparing means indicates identity.

20. A transmitting system as claimed in claim 19, said code generation means including means for executing a hashing algorithm for determining addresses from words in said word code.

21. A transmitting system as claimed in claim 19, further comprising:

means for recognizing one or more characters of a word entered in said register, means for generating in response to the recognition a unique character, and means responsive to said unique character for causing said transmitting means to transmit character by character the characters of the word entered in said register.

22. A transmitting system as claimed in claim 21, said generating means further including means for generating a further unique character indicating termination of the character by character transmission.

* * * * *